United States Patent [19]

Nagaraj

[11] Patent Number: 5,642,077
[45] Date of Patent: Jun. 24, 1997

[54] WIDE BAND CONSTANT GAIN AMPLIFIER

[75] Inventor: Krishnaswamy Nagaraj, Somerville, N.J.

[73] Assignee: Lucent Technologies Inc., Murray Hill, N.J.

[21] Appl. No.: 509,562

[22] Filed: Jul. 31, 1995

[51] Int. Cl.⁶ .................................. H03F 3/45; H03F 1/30
[52] U.S. Cl. ............................................. 330/253; 330/149
[58] Field of Search ................................. 330/253, 258, 330/261, 149

[56] References Cited

U.S. PATENT DOCUMENTS

| 4,710,724 | 12/1987 | Connell et al. | 330/253 X |
| 5,124,666 | 6/1992 | Liu et al. | 330/253 |
| 5,198,780 | 3/1993 | Kase | 330/253 X |

*Primary Examiner*—Steven Mottola

[57] ABSTRACT

An amplifier comprises an input transistor for receiving an input signal and a current source having a first and a second terminal, coupled to the input transistor at said first terminal and being adapted to be coupled to a direct current (DC) power supply at said second terminal. An active load is coupled to said input transistor, said active load being adapted to be biased by a biasing signal such that a noise signal at said second terminal is substantially attenuated at said first terminal. In accordance with another embodiment of the invention, in an amplifier, a method for providing a constant gain over a substantially wide frequency range, comprises the steps of receiving a differential input signal by a differential input stage of the amplifier so as to generate an output current signal in response to said input signal; transforming said output current signal to an output voltage signal; and substantially attenuating noise signals generated by a direct current (DC) power supply coupled to said amplifier in a manner so as to reduce the noise signal in said output voltage signal.

18 Claims, 2 Drawing Sheets

WIDE BAND CONSTANT GAIN AMPLIFIER

RELATED APPLICATIONS

This patent application is related to concurrently filed patent application Ser. No. 08/509,563, entitled "MPSK DEMODULATOR," (Dwarakanath 6-4-1-13-1) by M. R. Dwarakanath et.al, and incorporated herein by reference; concurrently filed patent application Ser. No. 08/509,072, entitled "VOLTAGE-TO-CURRENT CONVERTER," (Lakshmikumar 6) by K. Lakshmikumar, and incorporated herein by reference; and concurrently filed patent application Ser. No. 08/509,073, entitled "RING OSCILLATOR," (Lakshmikurnar 5) by K. Lakshmikumar, and incorporated herein by reference.

FIELD OF THE INVENTION

This invention relates to an amplifier and, more specifically, to a substantially wide band constant gain amplifier.

BACKGROUND OF THE INVENTION

A common component used in electronic circuits is an amplifier. Differential amplifiers, for example, are widely used in various types of analog integrated circuits (ICs), such as operational amplifiers, voltage comparators, voltage regulators, video amplifiers, and modulators and demodulators. Likewise, differential amplifiers also find use in emitter-coupled digital logic (ECL) gates and as the first stage of operational amplifiers and other integrated circuits (ICs).

Amplifiers may be configured to have open loop or closed loop arrangements. These alternative arrangements have corresponding advantages and drawbacks. For example, in a closed loop arrangement, also known in the art as a negative feedback arrangement, an inverted portion of the output signal of an amplifier is combined with its input signal. It is well-known that this arrangement provides relatively good gain tolerance. Thus, the gain of the amplifier remains substantially constant in response to changes in characteristics of the components of the amplifier. For example, the gain of an amplifier employed in a closed loop arrangement remains substantially unaffected by mismatches in the transistors that form the amplifier. However, the frequency response of a negative feedback amplifier is limited. This may be an issue for applications in which the amplifier is used to amplify high frequency communication signals. For input signals above a certain frequency, the amplifier may become unstable. As the frequency of an input signal increases, the phase of the output signal of the amplifier changes. At a certain frequency, the phase of the output signal may deviate 180 degrees from the phase of the input signal. At this frequency, the negative feedback signal becomes a positive feedback signal and may cause oscillation.

In contrast, an amplifier employed in an open loop configuration has a very wide bandwidth response. Open loop amplifiers accommodate signals over a wide frequency spectrum, without the disadvantages associated with amplifiers employed in closed loop configuration, as mentioned above. Thus, when operating at higher frequencies, an open loop amplifier may be more desirable than a closed loop amplifier. However, one drawback of open loop amplifiers is the difficulty of maintaining a relative constant gain in situations where there are mismatches between the transistors that form the amplifier. Some open loop amplifier designs, like the one illustrated in FIG. 2, provide a relatively constant gain.

FIG. 2 illustrates a prior art differential amplifier 10, including input transistors 12 and 46, configured to receive a differential input signal, such as an input voltage signal, to be amplified. Source 16 of input transistor 12 and source 42 of input transistor 46 are coupled together and to a current source 48. The current source may be realized in a variety of ways, such as using a MOSFET transistor that operates in its saturation region, or a BIPOLAR transistor that operates in its active region. Source 26 of a load transistor 24 is coupled to drain 18 of input transistor 12. Similarly, source 34 of a load transistor 36 is coupled to drain 40 of input transistor 46. Gate 22 and drain 20 of load transistor 24 are coupled together and to a direct current (DC) power supply 28 that provides a substantially DC voltage signal, $V_{DD}$. Similarly, gate 32 and drain 30 of load transistor 36 are coupled to each other and to DC power supply 28. Load transistors 24 and 36 operate as active loads. Active loads are well-known, and described in *Analog Integrated Circuits*, by Sidney Socolof (Prentice Hall, 1985), incorporated herein by reference. Typically, a differential amplifier, such as amplifier 10 illustrated in FIG. 2, in response to an alternating current (AC) input signal, generates an AC output current signal in each one of its branches, such as drains 18 and 40 in this example. An active load, such as load transistor 24 or 36, in this example, transforms the AC output current signal into an output voltage signal across terminals 38 illustrated in FIG. 2. As will be explained in more detail, hereinafter, the conductance of an active load, at least in part, contributes to the amount of the gain of the amplifier.

However, a drawback of an amplifier employed in an open loop configuration, like the one illustrated in FIG. 2, is a relatively lower power supply rejection ratio (PSRR), compared to amplifiers employed in closed loop configurations. DC power supplies, providing a DC power signal to such amplifiers, may sometimes generate AC ripple or noise signals that may influence the output signal of an amplifier. PSRR, as explained in more detail hereinafter, is a measure of the extent to which the AC noise signals of a power supply affect the operation of the amplifier.

For amplifiers employed in closed loop configurations, the PSRR is usually acceptably high. However, for amplifiers employed in open loop configuration, like the one illustrated in FIG. 2, noise signals generated in DC power supply 28, may influence the output voltage of the amplifier due to a feedthrough of supply voltage fluctuations into the signal path of the amplifier. Supply voltage noise or fluctuations may be caused, for example, by an AC ripple or noise signal present at the output terminal of the DC power supply. Typically, a DC power supply uses a rectifier to convert an AC line voltage signal to a DC voltage signal followed by a filter circuit. AC ripple or noise signal may propagate to the output of the power supply. Other types of noise and interferences in the AC line voltage may also cause supply voltage fluctuations.

The power supply rejection ratio, PSRR, in this context is defined as the ratio of change in the input offset voltage resulting from a change in the supply voltage to the change in the supply voltage, and is usually expressed in decibels (dB). For input signals with relatively small voltage amplitudes, a relatively high PSRR is desirable. Otherwise the signal-to-noise ratio of the amplifier would become unacceptably low.

Thus, a need exists for an open loop amplifier with a substantially high power supply rejection ratio, that provides a substantially constant gain over a wide bandwidth and also provides an output voltage signal, in which noise signals generated by the DC power supply that drives the amplifier are substantially attenuated.

SUMMARY OF THE INVENTION

Briefly, in accordance with one embodiment of the invention, an amplifier comprises: an input transistor for receiving an input signal; a current source having a first and a second terminal, the current source being coupled to the input transistor at the first terminal and being adapted to be coupled to a direct current (DC) power supply at the second terminal; and an active load coupled to the input transistor, the active load being adapted to be biased by a biasing signal, such that a noise signal at the second terminal is substantially attenuated at the first terminal.

Briefly, in accordance with another embodiment of the invention, in an amplifier, a method for providing a constant gain over a substantially wide frequency range, comprising the steps of: receiving a differential input signal by a differential input stage of the amplifier so as to generate an output current signal in response to the input signal; transforming said output current signal to an output voltage signal; and substantially attenuating noise signals generated by a direct current (DC) power supply adapted to be coupled to said amplifier in a manner so as to reduce the noise signal in the output voltage signal.

BRIEF DESCRIPTION OF THE DRAWINGS

The subject matter regarded as the invention is particularly pointed out and distinctly claimed in the concluding portion of the specification. The invention, however, both as to organization and method of operation, together with features, objects, and advantages thereof may best be understood by reference to the following detailed description when read with the accompanying drawings in which:

DETAILED DESCRIPTION OF THE DRAWINGS

Figure 2:
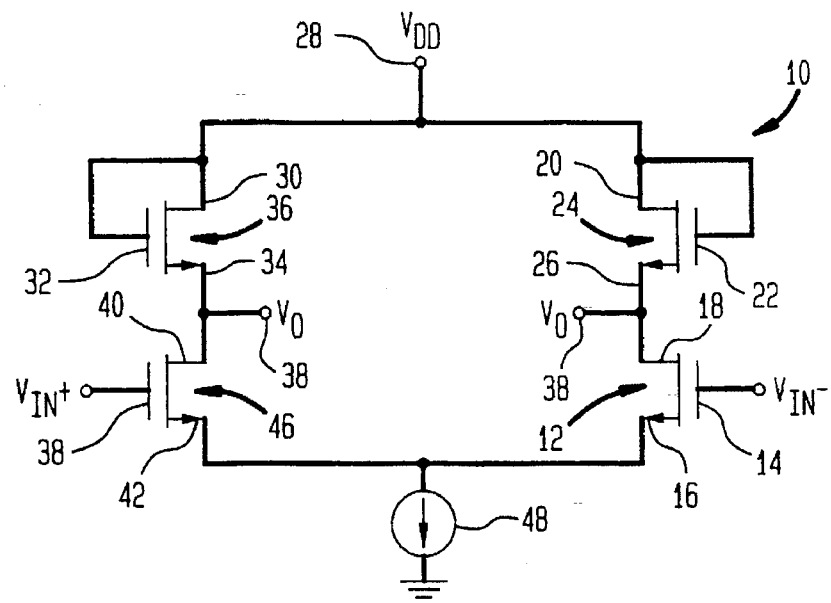
FIG. 2 is a circuit diagram illustrating a prior art open loop differential amplifier.

In a matched circuit arrangement, employed in an amplifier, such as illustrated in FIG. 2, the transconductance (gm), of transistors 12 and 46 are substantially equal. Likewise, the transconductance of transistors 24 and 36 are substantially equal. Therefore, the voltage gain of amplifier 10 illustrated in FIG. 2 may be expressed as $$A_{ol}=g_m(12,46)/g_m(24,36) \qquad [1]$$

wherein, $A_{ol}$ is the open loop voltage gain, $g_m(12, 46)$ is the transconductance of either one of input transistors 12 or 46, and $g_m(24, 36)$ is the transconductance of either one of load transistors 24 or 36. Thus, amplifier 10 provides a substantially constant gain over a large bandwidth because of its open loop configuration. However, as mentioned earlier, the power supply rejection ratio (PSRR) of amplifier 10 is relatively low, and, thus, is undesirable for some applications, such as, for example, low voltage input signals with amplitudes on the order of millivolts.

Figure 1:
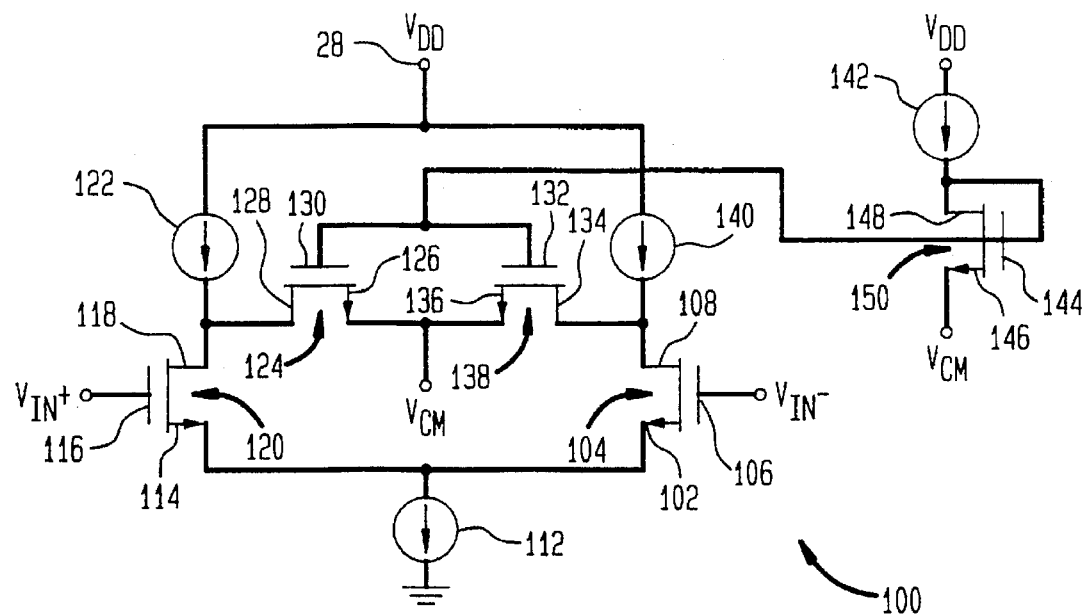
FIG. 1 is a circuit diagram illustrating one embodiment of an open loop amplifier in accordance with the present invention.

FIG. 1 illustrates amplifier 100, which is one embodiment in accordance with the present invention. Amplifier 100 has improved gain and power supply rejection ratio, compared to amplifier 10, as explained hereinafter below. It will, of course, be appreciated that the present invention is not limited in scope to the circuit illustrated in FIG. 1.

In accordance with one embodiment of the invention, amplifier 100 employs MOSFET transistors. However, it will be appreciated by those skilled in the art that the present invention is not limited in scope to MOSFET transistors and other types of transistors may be employed. Input transistors 104 and 120 are configured as a differential input stage, with their respective sources 102 and 104 coupled together and to a current source 112. Current source 112 may have one of many available designs, such as mentioned previously in reference with FIG. 2. Therefore, the invention is not limited in scope to a particular current source design or approach. Drain 108 of input transistor 104 is coupled to drain 134 of a load transistor 138. Gate 106 of input transistor 104 is coupled so as to be the input port, −Vin, of differential amplifier 100. Drain 118 of input transistor 120 is coupled to drain 128 of a load transistor 124. Gate 116 of input transistor 120 is coupled so as to be the other input port, +Vin, of differential amplifier 100. Furthermore, source 136 of load transistor 138 is coupled to source 126 of load transistor 124. Gates 130 and 132 of load transistors 124 and 138 are coupled together and to gate 144 of a biasing transistor 150. Load transistors 138 and 124 of amplifier 100 operate as active loads for input transistors 104 and 120, respectively. Amplifier 100, in response to an input signal, such as a differential input voltage signal, applied to the input terminals of its differential input stage, provides an output current signal that flows through drains 108 and 118, respectively. Thus as active loads, load transistor 104 and 120, in this example, transform the output current signal into an output voltage signal across drains 108 and 120.

Drains 108 and 134 are also coupled to a current supply 140. Similarly, drains 128 and 118 are coupled to a current supply 122. Current supplies 140 and 122 are respectively coupled to a DC power supply 28, and may have one of many available arrangements, such as a MOSFET transistor operating in its saturation region, as previously discussed. The current signal, $I_1$, provided by each one of current sources 140 and 122 is one half of current signal, $2I_1$, provided by current source 112.

Sources 136, 126 are respectively coupled to a DC biasing voltage source Vcm. In this embodiment, the voltage signal from DC biasing voltage source, Vcm is filtered, and has substantially no fluctuations.

With respect to biasing transistor 150, drain 148 is coupled to gate 144 and to a current source 142. The current source is coupled to DC power supply 28, generating voltage signal, $V_{DD}$, and provides a current signal, $I_2$. Again, a MOSFET transistor operating in its saturation region may be employed to operate as current source 142, although the invention is not limited in scope in this respect. Source 146 of biasing transistor 150 is coupled to DC biasing voltage source Vcm. In operation, transistor 150, in conjunction with current source 142 and voltage source Vcm, provide a biasing signal to load transistors 124 and 138. However, the invention is not limited in scope in this respect and other circuit arrangements may be employed to apply a biasing signal to the load transistors. The gain of amplifier 100 may be derived as explained hereinafter.

The conductance constants of input transistors 104 and 120 are substantially equal and designated by a constant $K_1$. The conductance constants of input transistor 138 and 124 are substantially equal and designated by a constant $K_2$. Finally, the conductance constant of transistor 150 is designated by a constant $K_3$.

For transistors 150, 138 and 124, due to the configuration illustrated, $$V_{GS}(150)=V_{GS}(138)=V_{GS}(124) \quad [2]$$

where $V_{GS}$ is the voltage signal across the gate and the source of each transistor. It is well-known that $$V_{GS}(150)=\sqrt{\frac{I_2}{K_3}}+V_T \quad [3]$$

wherein, $V_T$ is the threshold voltage signal below which transistor 150 may not operate.

Furthermore, for load transistors 138 or 124, it is well-known that $$g_{ds}(138, 124)=2K_2[V_{GS}(150)-V_T] \quad [4]$$

where, $g_{ds}$ (138, 124), is the output conductance across the drain and source of either one of load transistors 138 or 124. By substituting equation [3] into [4], $$g_{ds}(138,124)=2K_2\sqrt{\frac{I_2}{K_3}}=2\sqrt{\frac{K_2^2}{K_3}I_2} \quad [5]$$

Furthermore, for input transistors 104 and 120, it is well-known that $$g_m(120,104)=2K_1\sqrt{\frac{I_1}{K_1}}=2\sqrt{K_1 I_1} \quad [6]$$

where $g_m(120, 104)$ is the transconductance of either one of input transistors 120 or 104. The gain of amplifier 100 may be expressed as $$A_{ol}=\frac{g_m(120,104)}{g_{ds}(124,138)} \quad [7]$$

By inserting equations [5] and [6] into [7] the gain of amplifier 100 may be written as $$A_{ol}=\frac{2\sqrt{K_1 I_1}}{2\sqrt{\frac{K_2^2 I_2}{K_3}}}=\frac{\sqrt{K_1 I_1}}{\sqrt{\frac{K_2^2 I_2}{K_3}}} \quad [8]$$

Thus, an embodiment of an amplifier in accordance with the present invention, such as amplifier 100, provides a substantially constant gain over a wide frequency range. When the characteristics of transistor 150 are substantially the same as transistors 138 and 124 such that $K_2=K3$ equation [8] may be written as $$A_{ol}==\frac{\sqrt{K_1 I_1}}{\sqrt{K_2 I_2}} \quad [9]$$

However, as illustrated in FIG. 1, the output terminals of amplifier 100 are substantially isolated from DC power supply 28 by a substantially high impedance path such that noise signal generated by the DC power supply is substantially attenuated. Thus, the noise signal attributable to the DC power supply in the output voltage signal of amplifier 100 is substantially attenuated. Furthermore, it will be appreciated that the gain of an embodiment of an amplifier of the present invention may be controlled by varying the values of $K_1$, $K_2$, and $K_3$, as well as values $I_1$ and $I_2$. Such an arrangement allows for an improved degree of gain control in comparison with prior art amplifier designs.

Figure 3:
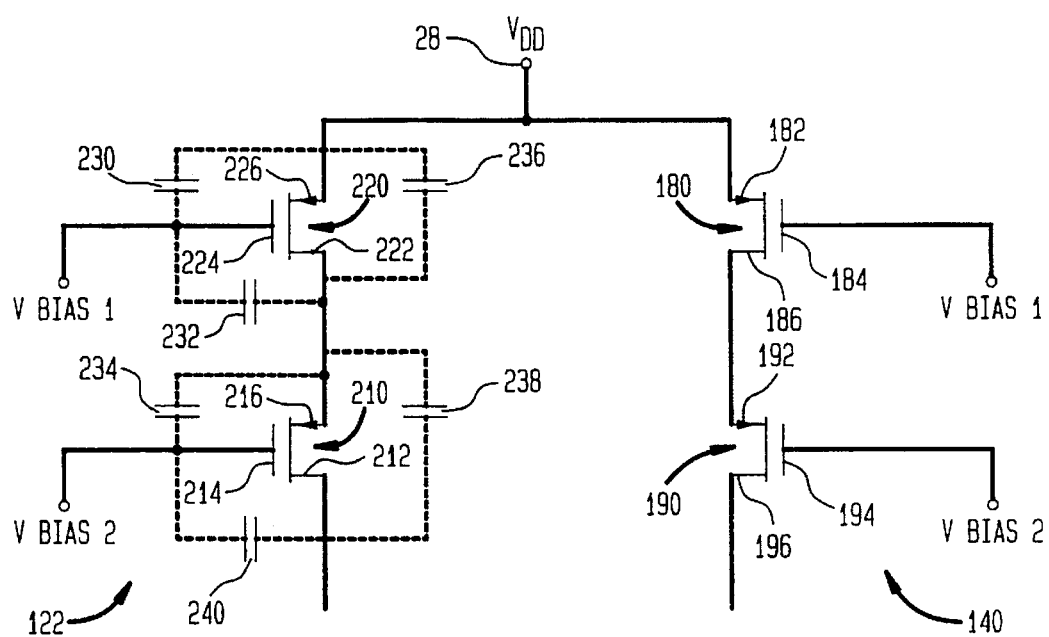
FIG. 3 is a circuit diagram illustrating an embodiment of a current source that may be used in the embodiment of FIG. 1.

FIG. 3 illustrates an embodiment of current sources 140 and 122, although the present invention is not limited in scope to such a current source arrangement or configuration. As illustrated, current source 140 is formed by two transistors 180 and 190, employed in a cascode arrangement. Likewise current source 122 is formed by two transistors 220 and 210, employed in a cascode arrangement. Cascode arrangements are well known and described in *Microelectronics, Digital and Analog Circuits and Systems*, by Jacob Millman (McGraw Hill, 1979). A cascode arrangement substantially improves the operation of current source 122 and 140. Sources 182 and 226 of transistors 180 and 220 are coupled together and to DC power supply 28. Gates 184 and 224 of transistors 180 and 220 are coupled to a voltage bias source, VBIAS 1. Drain 186 of transistor 180 is coupled to source 192 of transistor 190. Source 216 of transistor 210 is coupled to drain 222 of transistor 220. Gate 194 of transistor 190 and gate 214 of transistor 210 are coupled to DC bias source, V BIAS 2. Drain 196 of transistor 190, and drain 212 of transistor 210 are respectively coupled to drains 108 and 118 of FIG. 1.

The transistors forming current sources 140 and 122 have inherent capacitance effects. Thus, transistor 220 has gate-source capacitance 230, gate-drain capacitance 232 and drain-source capacitance 236. Similarly, transistor 210 has gate-source capacitance 234, gate-drain capacitance 240 and drain-source capacitance 238. FIG. 3 does not show the equivalent capacitance for current source 140. Capacitor 230 is coupled between DC power supply 28 and DC bias source V BIAS 1. For AC noise signals generated by DC power supply 28, V BIAS 1 operates as an AC ground. Thus, the noise signal flowing through capacitor 230 is substantially attenuated by flowing to DC bias source VBIAS 1, which acts as a ground for AC signals. One path that the noise signal generated by DC power supply 28 may substantially propagate, is formed by capacitors 236 and 238 in series. However, the capacitance of these capacitors is substantially small, and their combination in series yields an even smaller capacitance. Thus, the effective impedance between $V_{DD}$ and input transistors 104 and 120 (FIG. 1) increases substantially in comparison with prior art amplifier arrangements. This substantially higher impedance path between DC power supply 28 and the output voltage ports of amplifier 100 substantially attenuates the noise signal generated by the DC power supply. The noise signal attributable to the DC power supply in the output voltage signal of the amplifier becomes substantially attenuated. Thus, current sources 122 and 140 operate as an attenuation stage for amplifier 100 so as to attenuate noise signals generated by DC power supply 28. As a result, the power supply rejection ratio (PSRR) of amplifier 100 substantially improves in comparison with that of prior art circuits.

It will be appreciated that an amplifier in accordance with the present invention obtains a relatively high power supply rejection ratio. In addition, an amplifier in accordance with the present invention provides a substantially constant gain with a better degree of gain control in comparison with prior art amplifiers.

While only certain features of the invention have been illustrated and described herein, many modifications, substitutions, changes or equivalents will now occur to those skilled in the art. It is therefore, to be understood that the appended claims are intended to cover all such modifications and changes as fall within the true spirit of the invention.

I claim:

1. An amplifier having an input terminal and an output terminal comprising:

an input transistor configured to receive an input signal at said input terminal;

a current source having a first and a second terminal, said first terminal being coupled to said input transistor and to said output terminal and said second terminal being coupled to a direct current (DC) power supply conductor, so as to substantially isolate voltage noise signal generated by a DC power supply from said output terminal; and an active load coupled to said input transistor and to said output terminal, said active load being adapted to be biased by a biasing signal such that noise signal generated by said DC power supply is substantially isolated from said active load so that said noise signal is substantially attenuated at said output terminal.

2. The amplifier of claim 1, wherein said current source comprises transistors employed in a cascode arrangement.

3. The amplifier of claim 1, wherein said active load comprises a transistor.

4. The amplifier of claim 3, further comprising a transistor coupled to a biasing current source coupled to said active load in a configuration so at to produce said biasing signal.

5. The amplifier of claim 4, wherein said input signal comprises a differential input voltage signal, and said noise signal is attributable, at least in part, to said DC power supply.

6. A differential amplifier having input terminals and output terminals comprising:

a differential input stage having first and second input transistors, each of said input transistors having a gate, a source and a drain terminal such that the respective gates of said transistors are coupled so as to receive a different input signal, and the respective sources of said transistors are coupled together and to a first current source;

an active load stage having first and second load transistors such that the respective sources of said load transistors are coupled together and to a DC biasing voltage source providing a signal with substantially no fluctuation, the respective drains of said load transistors are coupled to the respective drains of said input transistors so as to define said output terminal, and the gates of said load transistors are adapted to receive a bias signal, said gates of said load transistors being substantially isolated from said DC power supply; and second and third current sources adapted to be coupled to a DC power supply, each of said current sources being coupled to the drains of said input and load transistors so as to substantially isolate noise signals generated by said DC power supply from said output terminals, of said amplifier.

7. The amplifier of claim 6, wherein each one of said second and third current sources comprises at least two transistors employed in a cascode arrangement.

8. The amplifier of claim 7, wherein said cascode arrangement further comprises first and second current source transistors, the source of said first current source transistor being adapted to be coupled to said DC power supply, the respective drains of said first and second current source transistors being coupled together, and the source of said second current source transistor being coupled to the drains of said input and load transistors.

9. The amplifier of claim 8, wherein a biasing circuit coupled so as to provide said biasing signal comprises a biasing transistor such that the gate and the drain of said biasing transistor are coupled together and to a biasing current source.

10. The amplifier of claim 9, wherein the source of said biasing transistor and the respective sources of said load transistors are coupled to a biasing voltage source.

11. An amplifier comprising:

a differential input stage for receiving a differential input signal, said differential input stage further comprising input and output terminals;

an active load stage coupled to a DC power supply, for providing an active load for said differential input stage, wherein said active load stage is substantially isolated from said DC power supply; and a biasing circuit for biasing said active load stage, such that noise signals attributable to said DC power supply are substantially attenuated at said output terminals and such that the gain of said amplifier remains substantially constant for a substantially predetermined range of operating frequencies.

12. The amplifier according to claim 11, wherein said differential input stage comprises first and second input transistors, each of said input transistors including a gate, a source and a drain terminal such that respective gates of said input transistors are adapted to receive a differential input signal, and the respective sources of said input transistors are coupled together and to a first current source; said active load stage including first and second load transistors such that respective sources of said load transistors are coupled together and respective drains of said load transistors are coupled to respective drains of said input transistors; said biasing circuit including a biasing transistor such that the gate and the drain of said biasing transistor are coupled together and to a biasing current source, said biasing stage being adapted to provide a bias signal to the gates of said first and second load transistors; and said attenuation stage having second and third current sources respectively adapted to be coupled to said DC power supply, each of said current sources being coupled to the drain of said input and load transistors.

13. The amplifier of claim 12, wherein said gain is substantially in accordance with the equation $$A_{ol} = \frac{\sqrt{K_1 I_1}}{\sqrt{\frac{K_2^2 I_2}{K_3}}}$$

wherein $A_{o1}$, is the gain of said amplifier, $K_1$, $K_2$, $K_3$ are respectively conductance constants of said input transistor, said load transistor and said biasing transistors, and $I_1$ and $I_2$ are currents provided by said attenuation stage and said biasing stage, respectively.

14. In an amplifier having input and output terminals and powered by a direct current (DC) power supply, a method for providing a constant gain over a substantially wide frequency range, comprising the steps of:

receiving a differential input signal by a differential input stage of said amplifier so as to generate an output current signal in response to said input signal, by employing an active load stage coupled to said differential input stage;

substantially isolating said direct current DC power supply from said active load stage;

transforming said output current signal to an output voltage signal at said output terminals; and substantially attenuating noise signals generated by a direct current (DC) power supply coupled to said amplifier by substantially isolating said direct current DC power supply from said output terminals, in a manner so as to substantially reduce the noise signal in said output voltage signal.

15. The method according to claim 14, wherein said step of attenuating further comprises the step of providing a current signal via a current source adapted to be coupled to said DC power supply and said differential input stage.

16. The method according to claim 15, wherein said differential input stage comprises first and second input transistors.

17. The method according to claim 16, wherein said active load comprises two transistors such that respective sources of said transistors are coupled together and respective gates of said transistors are coupled together and respective drains of said transistors are coupled to said differential input stage.

18. The method according to claim 17, wherein said step of providing current via a current source further comprises the step of providing current through at least two transistors in a cascode arrangement.

* * * * *